United States Patent [19]

Fraser

[11] Patent Number: 4,745,354
[45] Date of Patent: May 17, 1988

[54] APPARATUS AND METHODS FOR EFFECTING A BURN-IN PROCEDURE ON SEMICONDUCTOR DEVICES

[75] Inventor: Douglas S. Fraser, Bloomington, N.Y.

[73] Assignee: FTS Systems, Inc., Stone Ridge, N.Y.

[21] Appl. No.: 900,530

[22] Filed: Aug. 26, 1986

Related U.S. Application Data

[63] Continuation-in-part of Ser. No. 736,421, May 20, 1985, abandoned.

[51] Int. Cl.$^4$ ........................................... G01R 31/26
[52] U.S. Cl. .................. 324/73 R; 62/259.2; 62/318; 62/374; 62/375; 165/80.4; 165/104.33; 324/158 F
[58] Field of Search ................ 62/85, 125, 127, 128, 62/150, 195, 228.1, 228.4, 259.2, 285, 291, 317, 318, 373, 374, 376, 378, 474, 475, 268, 270; 324/73 R, 158 F; 165/80.2, 80.4, 104.33, 108, 160; 417/362; 73/304 R

[56] References Cited

U.S. PATENT DOCUMENTS

| | | | |
|---|---|---|---|
| 1,227,443 | 5/1917 | James | 62/373 |
| 2,643,282 | 6/1953 | Greene | 62/259.2 X |
| 3,270,250 | 8/1966 | Davis | 165/104.33 X |
| 3,560,849 | 2/1971 | Ryan et al. | 324/73 R |
| 3,584,643 | 6/1971 | Burke | 73/304 R X |
| 3,660,784 | 5/1972 | Scharfman | 165/104.33 X |
| 4,266,408 | 5/1981 | Krause | 62/85 X |
| 4,304,102 | 12/1981 | Gray | 62/85 X |
| 4,542,341 | 9/1985 | Santomango et al. | 324/158 F |

FOREIGN PATENT DOCUMENTS

2086621  5/1982  United Kingdom ............... 417/362

OTHER PUBLICATIONS

Aakalu, N., "Quick Acting Drier for Liquid Cooling Systems", IBM Technical Disclosure Bulletin, vol. 13, No. 11, Apr. 1971, p. 3548.
Jameson, G., "Temperature Cycling of Electrical Components," IBM Technical Disclosure Bulletin, vol. 13, No. 12, May 1971, pp. 3639-3640.

Primary Examiner—Reinhard J. Eisenzopf
Assistant Examiner—Stephen M. Baker
Attorney, Agent, or Firm—Lawrence J. Bassuk; Robert E. Wagner

[57] ABSTRACT

Semiconductor devices such as integrated circuits and discrete transistors are mounted on cards and the cards are installed on raised racks extending up from the bottom of a tank forming a burn-in chamber. The racks are individually lowered to immerse the cards and operating devices in a bath of liquid heat exchange medium at an elevated temperature. The racks are individually accessible through aligned segments of a segmented cover to reduce the intrusion of room water vapor into the burn-in chamber. The elevated temperature of the medium is maintained during the procedure by pumping the medium over mechanical cooling coils to remove excess heat produced by the operating devices. A lead screw and lever mechanical combination provide variable speed pumping, to accommodate changes in medium viscosity, from a fixed speed motor. The pumping also mixes the medium around the cards and devices to produce uniformity in the medium temperature. Medium and water vapors in the chamber are blown across acid absorbing material to remove hydrofluoric acid vapors and then across condensor coils to change them to liquids for conserving the expensive medium. The liquid water is separated from the intermixed liquids from the condensor in a separator that has deep wells and an electrode and bridge circuit to indicate the presence of a certain quantity of liquid water. The liquid water is discarded and the liquid medium is returned to the burn-in chamber. A filter removes particulate and chemical contaminants from the liquid medium, and a weir assembly channels contaminants that float on top of the medium to an agitation box and therefrom to the filter.

59 Claims, 7 Drawing Sheets

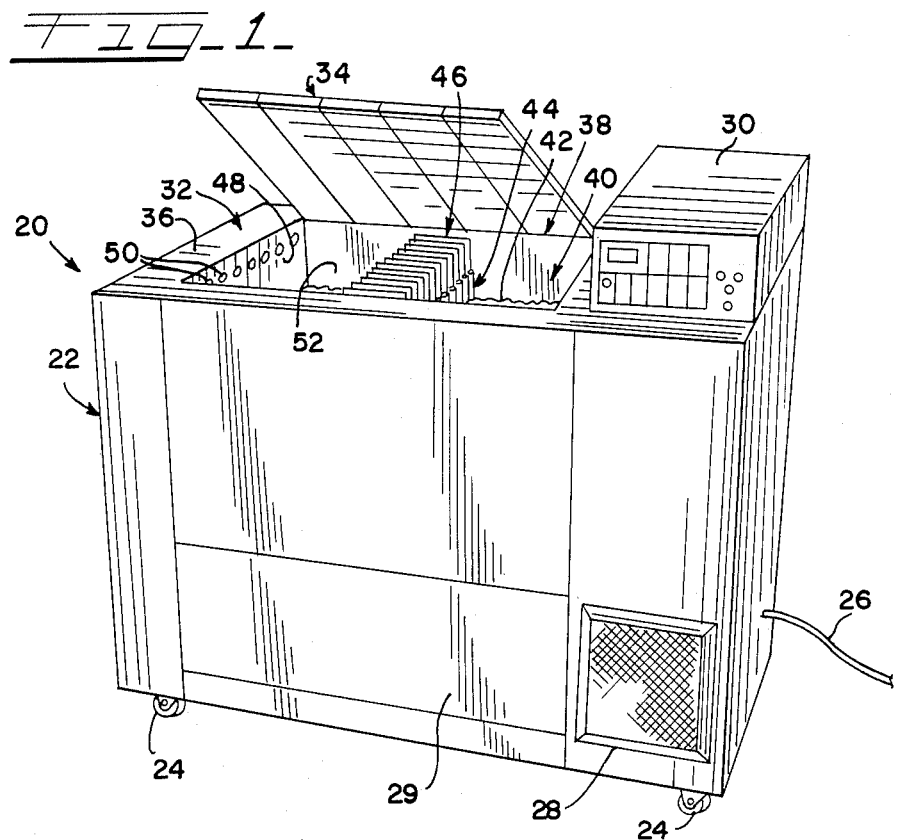
Fig_1
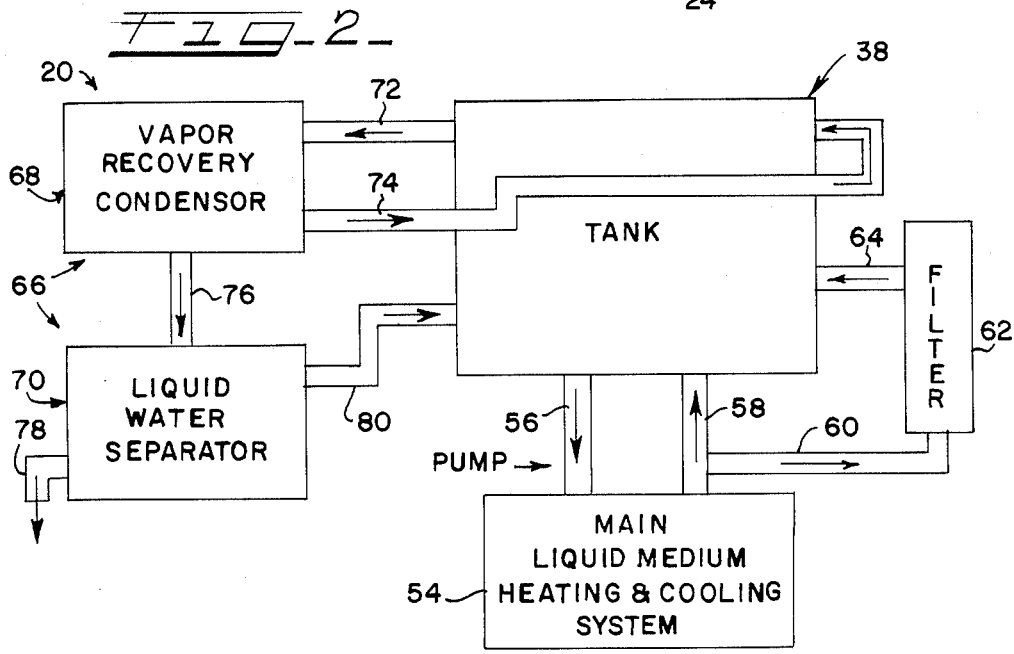
Fig_2

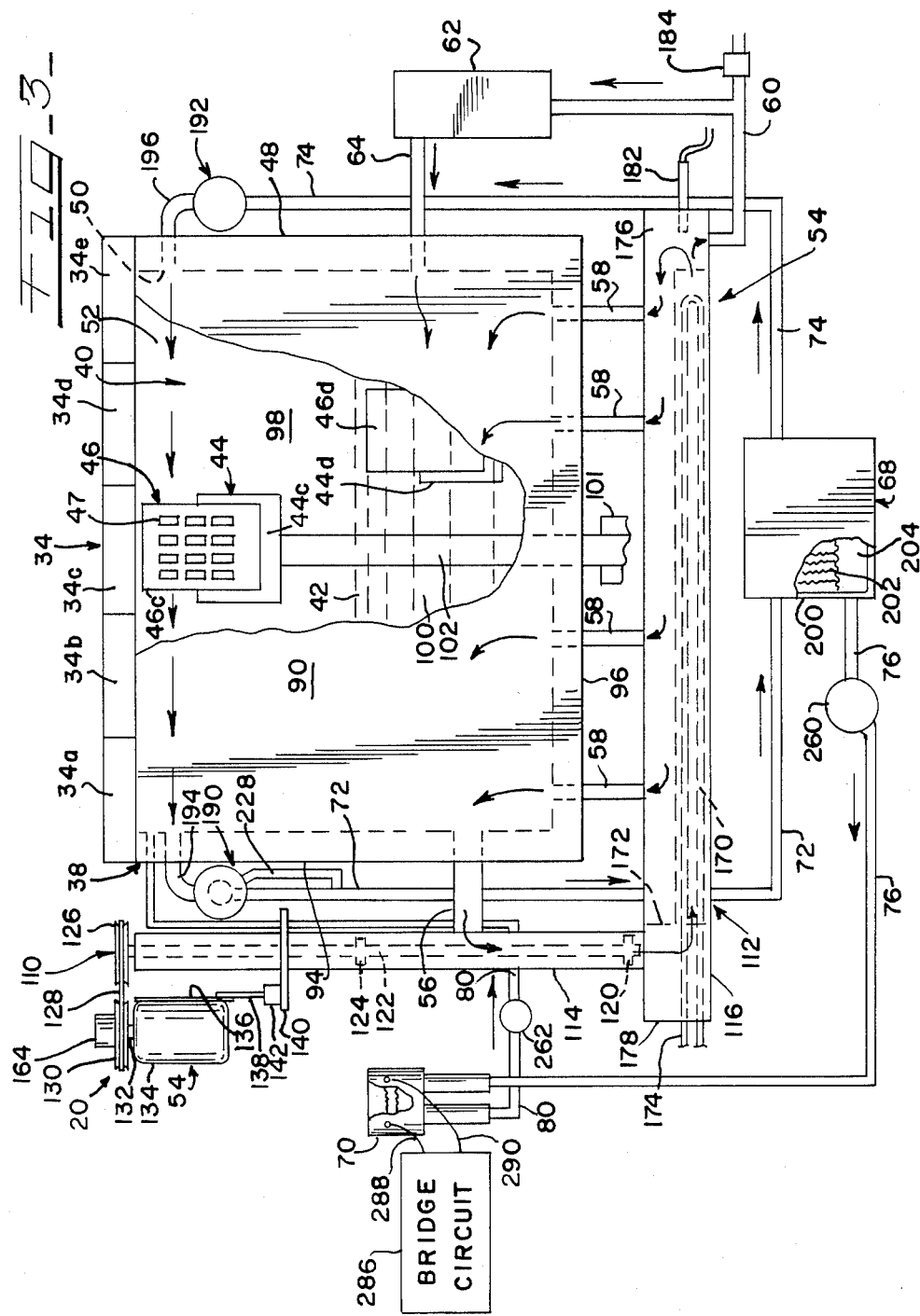

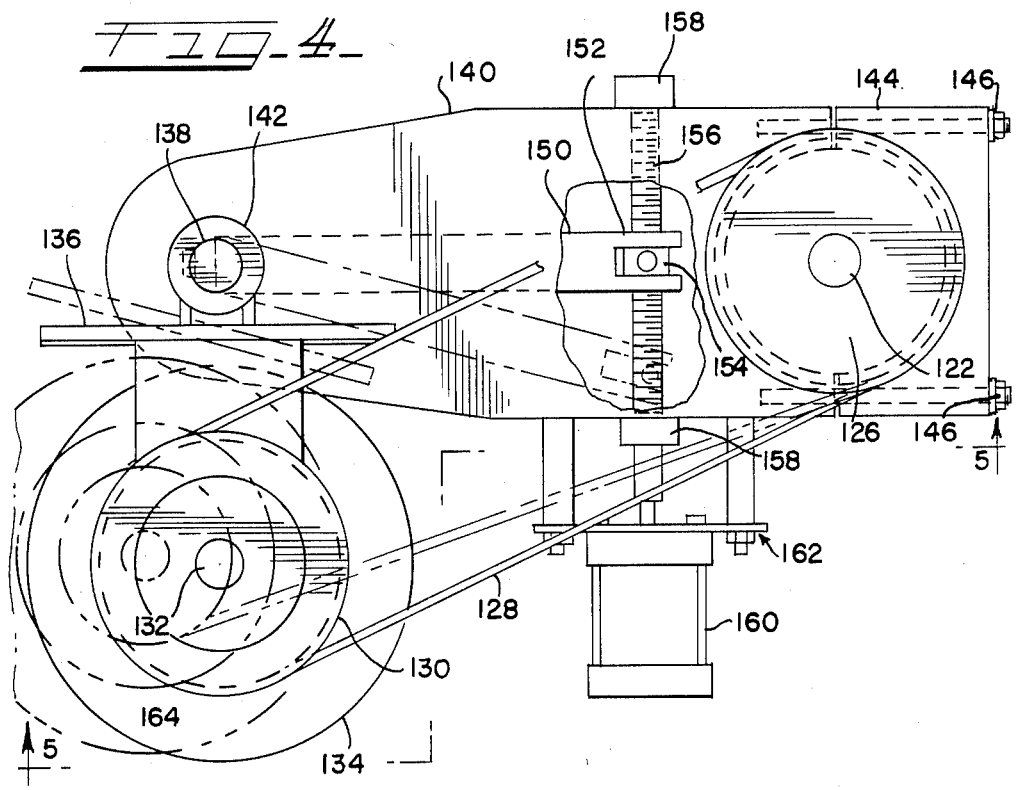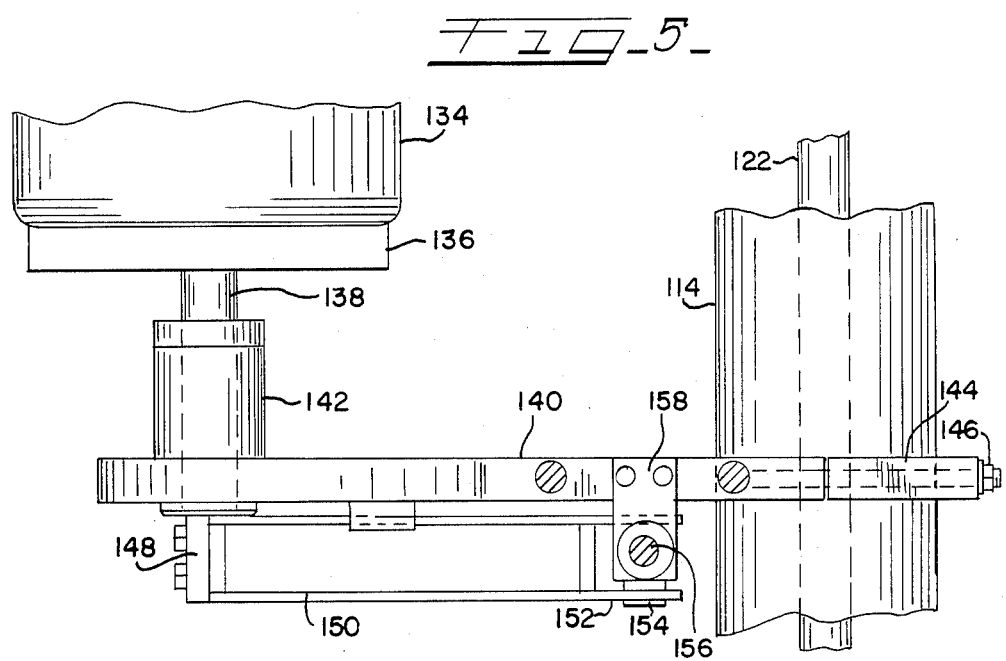

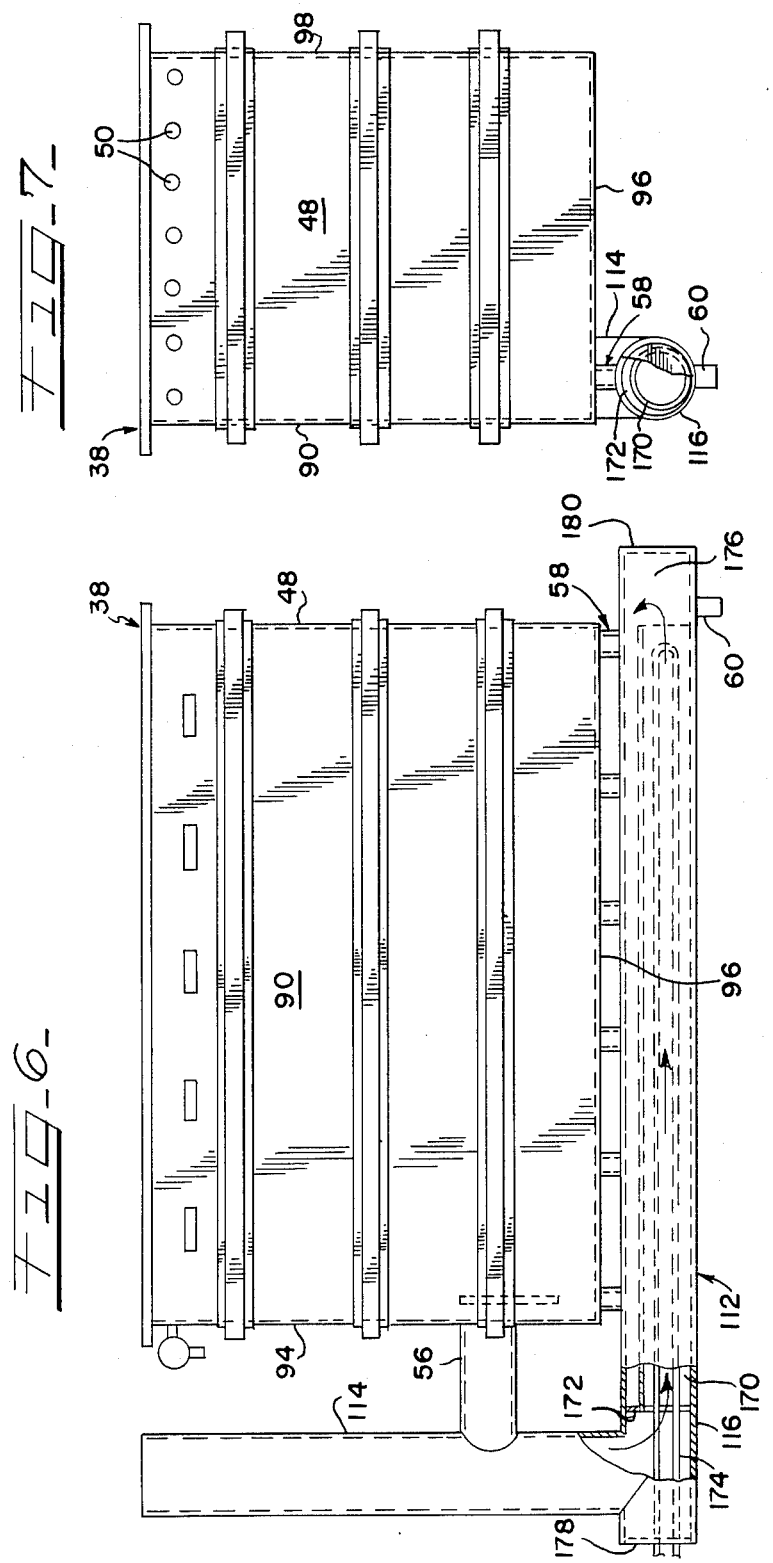

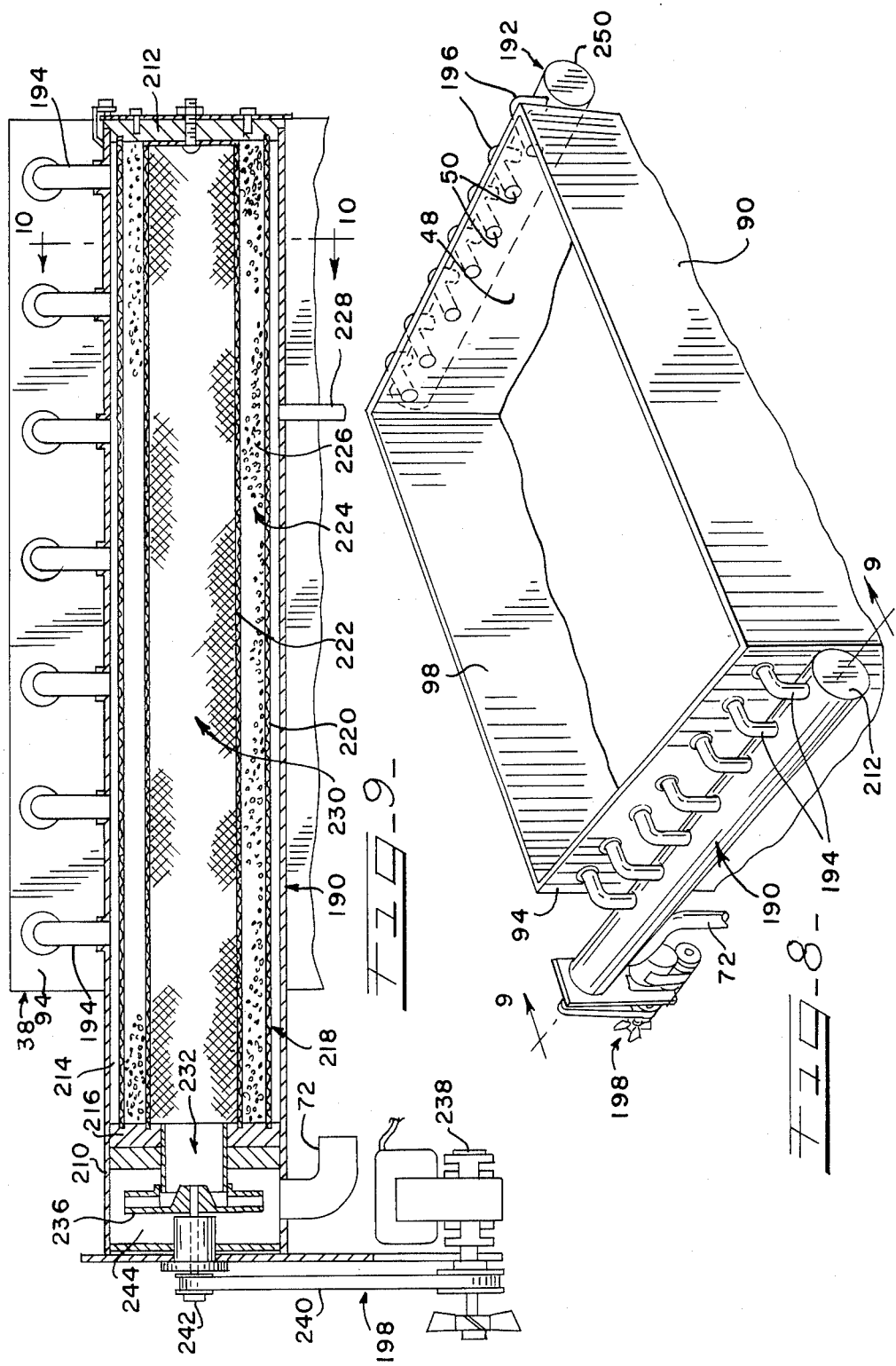

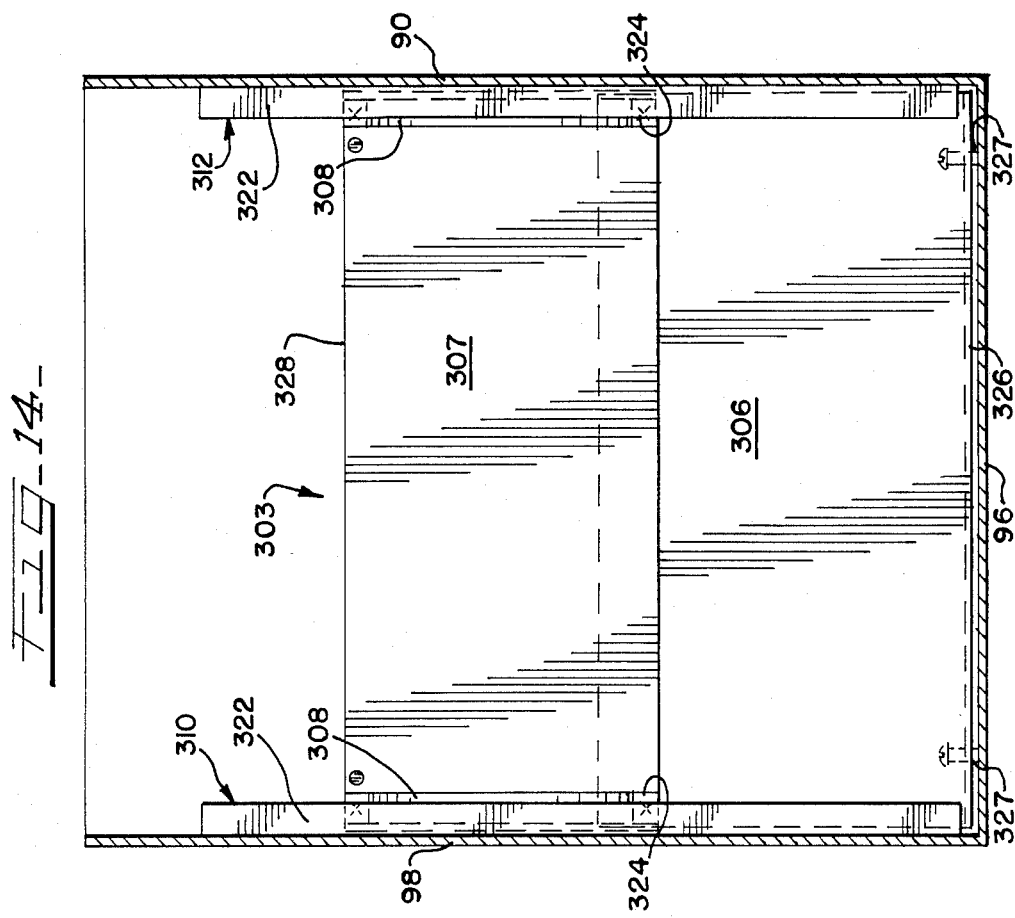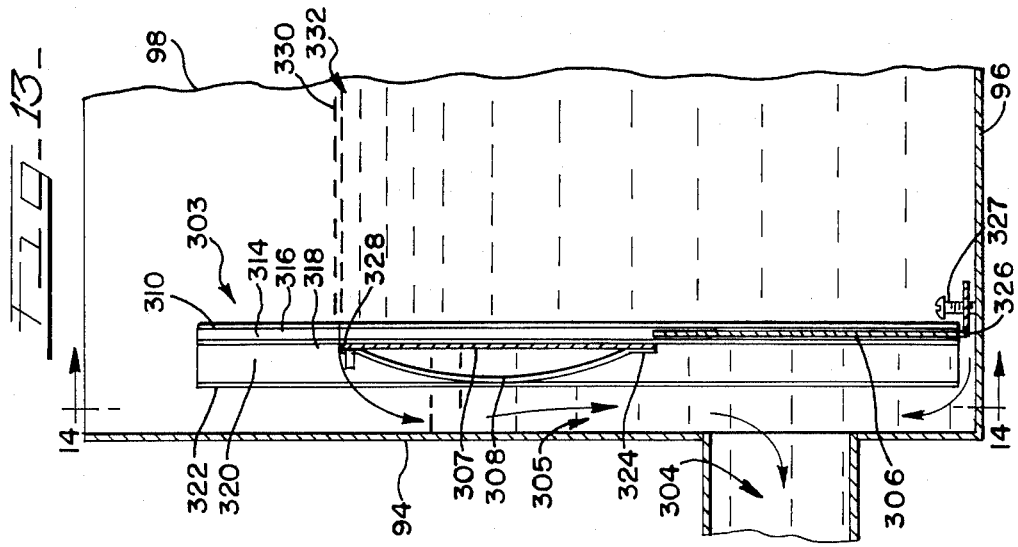

APPARATUS AND METHODS FOR EFFECTING A BURN-IN PROCEDURE ON SEMICONDUCTOR DEVICES

This application is a continuation-in-part of U.S. Ser. No. 736,421, filed May 20, 1985, abandoned.

DESCRIPTION

Background of the Invention

This invention relates generally to apparatus and methods for thermally accelerating temperature related failure mechanisms in semiconductor electronic devices or components, such as discrete transistors and integrated circuits, and particularly to such apparatus and methods in which the semiconductor devices are carried on circuit boards and are immersed in a liquid, heat exchanging medium for obtaining desired thermal conditions.

Semiconductor devices, such as discrete transistors and integrated circuits have time and temperature dependant failure mechanisms that occur at a high percentage rate during the first year of regular service. Thereafter, the surviving devices exhibit a low and relatively constant failure rate over the remainder of their useful lives of many years.

This high percentage failure rate is referred to as "infant mortality", since it occurs mainly during the first year of the life of a semiconductor device. Those devices that will fail during the first year can be substantially eliminated from commercially available products by subjecting the devices to precise elevated thermal conditions under electrical operating conditions. This procedure, or testing, called "burn-in", effectively accelerates the devices through one year of normal operation in approximately 168 hours, or one week Recently the burn-in procedure has been effected in a liquid, heat exchange or transfer medium. The semiconductor devices are loaded onto circuit cards and the cards are immersed in a bath of the liquid medium elevated to the desired temperature. The devices then are electrically operated for a period determined by a mathematical equation relating the operating parameters, including temperature, to accelerated life of the devices. The heat exchange medium, thus, serves to increase the ambient operating temperature of the devices and to dissipate received excess operating heat produced by the operating devices to maintain the devices at a precise, elevated ambient temperature.

The heat exchange medium typically is that known under the trademark Fluorinert liquid FC-40 manufactured by 3M Commercial Chemicals Division and is well known to be non-reactive and electrically insulating in such an environment. This medium has a specific gravity greater than water, a specific heat greater than air and is selected to have a boiling point greater than the elevated temperature at which the burn-in procedure is effected. Other silicone based liquid mediums also can be used.

Use of a liquid medium improves upon the use of gas mediums, such as air and nitrogen, in burn-in procedures and apparatus in that, among other things, the selected liquid medium has a greater specific heat or increased capacity to hold heat produced by the devices, can provide improved temperature control of the bath environment, especially with a high density of energy dissipation, and can absorb increased quantities of heat when vaporized by a localized "hot spot", such as a failed device, to prevent thermal runaway of that failed device. This last feature provides for continuance of the burn-in procedure without having to stop for removal of a single, failed device. A Fluorinert medium has some qualities, however, that must be specially cared for.

First, Fluorinert medium, which is unusually expensive, has a low evaporation rate at room temperature, but at the elevated temperatures of a burn-in procedure, has an evaporation rate that is significant. A burn-in effecting apparatus must thus provide for recovery of the evaporated liquid medium vapors to be cost efficient. The recovery must be performed carefully, however, because the Fluorinert medium vapors readily combine chemically with any included moisture to form hydrofluoric acid, which can erode the stainless steel and plastic components of the burn-in effecting unit. Thus, condensed water vapor must be separated from the condensed Fluorinert heat exchange medium vapor prior to return of the Fluorinert medium liquid to the bath.

Second, the Fluorinert medium must be controlled in temperature by a heater to raise the medium to the desired elevated temperature for effecting the burn-in procedure and by a cooler, such as a mechanical refrigeration unit, to remove excess heat produced by the operating devices from the bath medium during the burn-in procedure to maintain the elevated temperature and possibly to cool the medium at the end of the procedure.

Third, filtration must be provided to remove solid particulate and chemical contaminants, such as solder flux, debris and acids, introduced into or produced in the bath medium. Since the Fluorinert medium is twice the density of water, many solid contaminants can float on top of the medium in addition to other solid contaminants being suspended in the medium. Previously, the filtration systems effected a flow of the medium through the filter element and only removed the suspended solid particles. The floating particles never passed through the filtration system because they never sank in the medium to the filtration port. The floating contaminants instead were removed manually by an operator scooping them off the top surface of the medium with such as filter paper. Although inconvenient, this had been satisfactory since the semiconductor devices were continuously submerged and were surrounded by filtered medium and the floating contaminants were removed manually before removing the devices from the bath. Further, the devices were sealed so that minute solid, particulate contaminants had no effect on the operation of the devices.

A problem has recently arisen, however. Some users of the burn-in bath apparatus want to effect the burn-in procedures on semiconductor devices that are in an intermediate stage of production, that is to say, the covers have not yet been applied to the lead frames and the bare circuits are directly exposed to the bath medium. This can be advantageous to a manufacturer because, in complex and expensive hybrid devices carying several different chips, a burn-in failure at such an intermediate stage of manufacture can be repaired and a major portion of the device can be salvaged. A burn-in failure after the covers are sealed to the lead frames requires that the entire device be discarded, including the good portions. This old practice is of course wasteful and costly.

Conducting the burn-in procedure on un-covered devices presents little problem regarding contaminants suspended in the medium because suspended solid particles are well filtered from the medium and the uncovered devices remain clean, which is critical to their operation. The problem is removing the uncovered devices from the bath medium through the contaminants floating on top of the dense bath medium. A solution to this problem is necessary to be able to burn-in devices in an intermediate stage of production.

Lastly, such a burn-in apparatus should have a bath tank large enough to facilitate burn-in procedures of production quantities of semiconductor devices and be self contained upon connection to an electrical power supply. The apparatus should also provide easy circuit card handling.

SUMMARY OF THE INVENTION

In accordance with the invention a burn-in unit has a liquid medium receiving tank enclosing a burn-in chamber that is normally open to the top to facilitate installing and removing circuit cards therefrom carrying semiconductor devices for burn-in testing. The top of the burn-in chamber is closed with a cover during the burn-in testing or procedure. The apparatus includes a vapor recovery system, a main liquid medium heating and cooling system and a filter system. These three systems cooperate to effect the burn-in procedure for semiconductor devices installed in the tank chamber.

Further, movable racks in the tank chamber serve to lower and raise the circuit cards into and out of the liquid medium. This structure in combination provides a burn-in apparatus or unit that is efficient in conserving the expensive liquid Fluorinert medium, and that is self contained upon connection to an electrical power source. Lastly, each of the described systems have structure particularly suited to achieve the beneficial results of the burn-in apparatus with the liquid medium.

In particular, a rectangular box-like heat exchanger tank forms a burn-in chamber sufficiently deep to contain circuit cards at two levels: one level at the bottom of the chamber in which the circuit cards are completely immersed in the medium, and a second level at the top of the chamber in which the circuit cards are spaced above the medium. The cover for the tank is segmented to provide individual access to any one of the five racks of circuit card connectors in its raised position and reduce the quantity of ambient moisture vapor entering the burn-in chamber.

The main liquid medium heating and cooling system includes mechanical refrigeration cooling coils contained in a pipe under the tank. A pump assembly moves the medium from one side of the chamber to one end of the pipe for the medium to flow closely across the coils and from the other end of the pipe back to the bottom of the chamber through a larger counterflow tube enclosing the pipe and riser tubes vertically extending to the tank bottom. The pump, thus, removes medium from one location of the chamber and the riser tubes return the medium at a plurality of other locations to result in a good turbulence or mixing of medium that maintains the temperature of the medium in the chamber substantially constant. The flow of medium from and to the chamber also results in a flow of medium across the cards and semiconductor devices.

A cartridge or coil electrical heater extends into the counterflow tube to raise the medium temperature to the desired elevated temperature. The pump assembly includes a lead screw/nut arrangement to obtain a variable speed impeller rotation with a fixed speed electric motor to accommodate changes in medium viscosity at various medium temperatures.

The vapor recovery system includes an exhaust manifold and feed manifold on opposite ends of the tank and in fluid communication with the air, water vapor and medium vapor in the chamber above the liquid medium at the second, raised level of the circuit cards. A fan moves the air and vapors from the exhaust manifold, across expansion coils of a vapor condensor and back to the exhaust manifold. The fan also maintains a fluid flow of returned air across the length of the chamber to aid in evaporating the medium from cards and devices at the raised level. The exhaust manifold includes acid absorbing material to neutralize any hydrofluoric acid that may have formed by combination of the water and medium vapors.

A liquid water separator has a container that receives the mixture of liquid condensed water vapor and medium vapor from the condensor and allows the mixture to rest to separate the liquid water from the liquid medium; thereafter, the liquid medium is returned to the chamber and the liquid water is discarded. The liquid medium has a density greater than the liquid water so the liquid water tends to rise and float above the medium. An electric circuit includes a pair of opposed electrodes mounted on the wall of the container to ascertain the presence therebetween of liquid water, which contains sufficient metal ions to make it partially conductive. The circuit then indicates the presence of the liquid water and signals the operator that it is to be removed.

The filtration system includes a weir located in the burn-in chamber to channel a flow of liquid medium from at least the top surface of the bath to a filter element. This results in filtration of all the solid contaminants carried in or on the medium in the bath and leaves the entire burn-in chamber clean. The medium to be filtered is removed from the burn-in chamber by the main liquid heating and cooling system through a port in one end of the heat exchanger tank.

The weir comprises a pair of plates adjacent the port and extending from the front to the back of the tank substantially to block passage of the medium to the port, except as desired. One of the plates, a bottom plate, extends from the bottom of the tank upwardly and is substantially fixed in place. The other plate, a top plate, extends upwardly from the bottom plate and is manually adjustable. After a burn-in procedure has started and the volume of the liquid medium has stabilized to a certain top surface level, the top plate is manually adjusted so that its top edge is about a half or quarter inch below the top surface of the medium. This channels the top layer of medium and solid contaminants floating thereon over the weir and down to the port for transport to the filter element. The medium and floating contaminants falling over the top edge of the weir mixes the two together sufficiently for the medium to carry the contaminants to the filter. Contaminants that are not mixed with the medium and that remain floating after falling over the weir are positively separated from the devices in the bath and present no problem of affecting the devices.

The pair of plates are mounted in position by tracks welded to the front and back walls and closely engaging the plates to prevent leakage of medium between the tank and weir structures. The bottom plate can be set manually in a position with its bottom edge spaced from the tank bottom wall to facilitate some minimal flow of medium under the weir and to the port at all times. This insures a sufficient flow of medium to the main heating and cooling system at all times to prevent such as pump cavitation. The setting of the bottom edge is controlled by variable fasteners such as screws engaging the bottom wall of the tank.

The invention includes methods of achieving the results obtained with the described structure.

Other advantages and features of the invention will become apparent upon making reference to the specification, claims, and drawings to follow.

BRIEF DESCRIPTION OF THE DRAWINGS

FIG. 1 is a perspective view of a burn-in unit including the invention;

FIG. 2 is a block diagram of several systems of the apparatus;

FIG. 3 is an idealized rear elevation view of the systems illustrated in FIG. 2;

FIG. 4 is a plan view of a pump motor mounting structure of the invention;

FIG. 5 is a fragmentary side elevation view of the pump motor mounting structure, taken partly in section along the line 5—5 of FIG. 4 and in the direction indicated by the arrows;

FIG. 6 is a rear elevation view of a heat exchanger tank of the invention;

FIG. 7 is an end elevation view of the heat exchanger tank;

FIG. 8 is a fragmentary view of the top of the heat exchanger tank illustrating feed and exhaust manifolds of the invention;

FIG. 9 is a sectional view of the exhaust manifold taken along the line 9—9 of FIG. 8 and in the direction indicated by the arrows;

FIG. 13 is a side sectional view of the weir assembly in the heat exchanger tank; and FIG. 14 is a side sectional view of the heat exchanger tank with the weir assembly in front elevation.

DESCRIPTION OF THE PREFERRED EMBODIMENT

Figure 10:
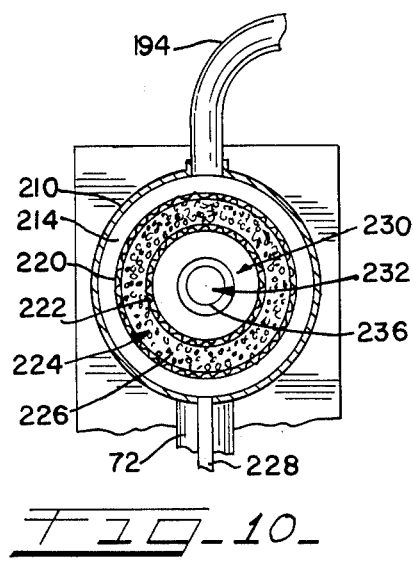
FIG. 10 is a sectional view of the exhaust manifold taken along the line 10—10 of FIG. 9 and in the direction indicated by the arrows.

A large, self-contained burn-in bath unit incorporating the invention hereof is indicated generally by the reference character 20. The unit comprises a generally rectangular box-like cabinet 22 mounted on casters 24 for ease of movement of the unit in such as a laboratory. Electrical connection of the unit 20 is by cord 26 to a suitable electrical power supply connection.

Cabinet 22 comprises sheet metal walls mounted on an internal frame. A ventilating screen 28 is mounted on the cabinet front wall 29 to facilitate ventilation of the mechanical refrigeration unit contained in the cabinet. An upper housing 30 encloses control circuits and mounts indicators of the status and condition of the unit. Input knobs and switches also can be mounted on upper housing 30. A top wall 32 of the cabinet comprises a segmented cover 34 and a surround portion 36 peripheral of the cover 34 in its closed position.

Interior of cabinet 22 a heat exchange tank 38 defines a rectangular burn-in chamber 40 that is generally open to the top and that can be closed by cover 34. Tank 38 contains a quantity of liquid heat exchange medium 42 and a plurality of circuit card carrying racks with one rack 44 carrying of plurality of circuit cards 46 being shown. A side wall 48 of the tank 38 includes a plurality of openings 50 for ventilation of the chamber space 52 above the medium 42.

Thus arranged, a technician can approach the unit from the front, raise the cover 34 and install or remove circuit cards 46 from a rack 44 in the burn-in bath chamber 40. Controls and indicators of the burn-in procedure are available on the front of the control housing 30 and the unit can be moved on the casters 24 to suitable locations in a laboratory or testing facility. Once connected to a source of electrical power by cord 26, the unit 20 is self-contained.

Interior of cabinet 22 are additional systems that operate to effect a desired burn-in procedure. In FIG. 2, tank 38 is connected to a main liquid medium heating and cooling system 54 by conduits 56 and 58. The main liquid medium heating and cooling system provides three functions. First, this system raises the temperature of the liquid medium to the desired elevated temperature at which the burn-in procedure is to be effected, this being accomplished by a heating element contained therein. Second, this system removes additional heat dissipated into the heat exchange medium by the operating semiconductor devices during the burn-in procedure, and third, serves to cool the liquid medium to ambient temperature at the termination of a burn-in procedure. This system thus serves as a temperature controller of the unit.

A portion of the liquid medium returning to the tank 38 in conduit 58 is carried by conduit 60 to a filter 62 and back to tank 38 through a conduit 64. Filter 62 serves to clean the liquid heat exchange medium by removing solid particulate and chemical contaminants introduced into the chamber or produced therein during the burn-in procedure. Although not shown in this block diagram, the filtration system includes a weir assembly interior of tank 38 that facilitates filtration of the heat exchange medium.

A vapor recovery system 66 comprises a vapor recovery condensor 68 and a liquid water separator 70. Gases including air, water vapor and medium vapor are exhausted from the tank 38 to the condensor 68 through duct 72. These gases, less the condensed water and medium vapors, are fed back to the tank in duct 74. The object of this recovery system 66 is conserving the supply of the expensive heat exchange medium through the closed loop of ducts 72, 74, condensor 20 and tank 38.

The liquid condensed water vapor and liquid condensed medium vapor are intermixed when condensed in the condensor 68 and are fed through duct 76 to liquid water separator 70. There the intermixed liquids are allowed to rest for the liquid water to separate from and rise above the liquid medium as a result of the liquid medium having a greater specific gravity than water and the water being insoluble in the medium. The liquid water then is removed through schematically illustrated duct 78 while the expensive and recovered liquid medium is returned to the tank by duct 80.

In FIG. 3, there is shown a structure, somewhat idealized, embodying the systems illustrated in block form in FIG. 2. Referring also to FIGS. 6 and 7, tank 38 has a rear wall 90, two side walls 48 and 94, a bottom wall 96 and a front wall 98. Tank 38 thus defines the burn-in chamber 40 that is closed on five sides by tank walls and is open to the top to be closed by cove 34. Cover 34 has five segments 34A through 34E that individually can be raised and lowered over the chamber 40 hinged at the rear wall 90 of the tank. The cover segments are arranged to be aligned with the racks and circuit cards carried by the racks for access to individual racks by raising individual cover segments. Thus cover segment 34C is aligned directly above rack 42C carrying cards 46C while cover segment 34D is arranged aligned above rack 42D carrying cards 46D.

Burn-in chamber 40 contains in subtantially its bottom half, the liquid heat exchange medium 42 previously generally described to be the Fluorinert perfluorinated hydrocarbons manufactured by the 3M Corporation. In particular, the heat exchange medium has a specific heat greater than air, a specific gravity greater than liquid water and a boiling point or temperature greater than the elevated temperature at which the burn-in procedure is to be effected.

The upper half or space 52 of chamber 40 is filled with ambient gases that can include water vapor and especially during a burn-in procedure can include Fluorinert medium vapor. The Fluorinert medium has a low evaporation rate at room temperature that increases markedly at the elevated temperature of a burn-in procedure. During a burn-in procedure, the racks 44 are in the lowered position to place their circuit cards 46 and the carried semiconductor devices in the medium 42 in the bottom half 100 of the chamber 40. Before and after testing, the racks 44 hold the cards 46 in the top half space 52 of the chamber. The movements of the racks 44 are by means such as a hydraulic or pneumatic cylinder 101 connected with shaft 102 which in turn carries the racks 44. Shaft 102 then is vertically movable into and out of the pneumatic or hydraulic cylinder 101.

The main liquid heating and cooling system 54 comprises a structure arranged adjacent the tank side wall 94 and bottom wall 96. In particular, the heating and cooling system 54 comprises a pump assembly 110 and a heating and cooling tube assembly 112.

In operation, the pump assembly 110 moves the liquid medium from the lower half 100 of burn-in chamber 40 through horizontally extending conduit 56, vertically extending conduit 114, horizontally arranged tube 116 of tube assembly 112 and then in a reverse direction therethrough and lastly through vertical riser pipes 58A through 58D back into the lower half 100 of chamber 40, the flow being indicated by the arrows in the described conduits, tubes and pipes.

Referring also to FIGS. 4 and 5, pump assembly 110 includes an impeller 120 carried at one end of a driven shaft 122 extending downward into substantially the length of conduit 114 with the impeller arranged adjacent tube 116. A bearing and baffle 124 are mounted inside the conduit 114 to stabilize the driven shaft 122 and to prevent up flow of liquid medium into the top half of conduit 114. The other end of driven shaft 122 extends above the top end of conduit 114 and carries thereon a driven pulley 126. A fixed length belt 128 connects the driven pulley 126 to a drive pulley 130 that is carried at the end of a drive shaft 132 of an electric motor 134.

The medium 42 changes its viscosity with a change in its temperature and, therefore, the impeller 120 needs to be driven at a particular desired speed when the medium is at room ambient temperature and at a different speed when the medium is at the elevated temperature for effecting the burn-in procedure. To attain this result with the constant speed electric motor 134, the pump assembly 110 includes a structure for varying the effective diameter of the drive pulley 130 while using a fixed length pulley belt 128. The function is effected through use of a lever arm and lead screw and nut arrangement varying the distance between the drive shaft 132 and the driven shaft 122 and using a spring actuated mechanism to vary the effective diameter of the pulley 130 that engages the fixed length belt 128.

In particular, electric motor 134 is mounted on a mounting plate that is in turn mounted on a rotatable pivot shaft 138. Pivot shaft 138 is mounted on a horizontal support plate 140 by means of a sleeve bearing 142. Plate 140 is clamped on the vertically extending tube 114 by a clamp portion 144 and clamp bolts 146.

The pivot shaft 138 passes downwardly through plate 140 and below plate 140 is connected to one end 148 of a lever arm 150. The other end 152 of lever arm 150 is connected to a lead nut 154 threaded onto a lead screw 156 mounted below the plate 140 by a pair of brackets 158. Lead screw 156 is mounted by brackets 158 for rotation around its longitudinal axis and is driven in such rotation by a stepping motor 160 mounted on support plate 140 by suitable bracket means 162.

In operation, stepping motor 160 rotates the lead screw 156 to move the lead nut 154 and lever arm end 152 to a selected position. This rotates or pivots the pivot shaft 138 to move the motor and its drive shaft 132 to a selected position on an arc around the pivot shaft 138, selecting a particular distance between the center of the drive shaft 132 and the center of the driven shaft 122. A spring mechanism 164 mounted on the drive pulley 130 varies the effective diameter of drive pulley 130 engaging belt 128 to accommodate the fixed length belt 128 operating with different distances between the drive and driven shafts. In FIG. 4, the solid lines indicate the position of the lever arm 150, and motor 134 in one position while the dashed or broken lines indicate the positions of these same structures at another selected position.

Thus, by incrementally stepping the stepping motor 160, variable speed rotation of the impeller driven shaft 122 can be obtained from a constant speed electric motor 134. This accommodates the varying pump requirements for the variable viscosity medium 42 without resorting to a variable speed drive motor and control device.

Referring now to FIGS. 3, 6, and 7, tube assembly 112 provides the desired heating and cooling of the liquid heat exchange medium to raise the temperature of the medium to the elevated temperature, remove energy dissipated into the medium by the operating semiconductor devices and cool the medium to ambient temperature. Assembly 112 comprises the earlier mentioned outer, horizontal tube 116 that is connected in fluid communication with the bottom end of vertically extending conduit 114. Outer tube 116 contains wholly therein an inner pipe 170 and a baffle 172. Pipe 170 rests on the bottom of the interior surface of outer tube 116 and can be held in position thereat, at least in part, by said baffle 172. Baffle 172 closes the space between the interior surfaces of horizontal tube 116 and pipe 170 so that liquid medium entering horizontal tube 116 can pass only into the interior of inner pipe 170.

The tube assembly 112 further comprises a cooling coil 174 that extends into one end of the tube 116 and into substantially the entire length of inner pipe 170. The cooling coil in the preferred embodiment is the evaporator coil of a mechanical refrigeration unit and is intended to remove energy from the liquid medium as the liquid medium passes thereacross. While only one loop of the cooling coil 174 is shown for clarity of the drawing, plural coils can be inserted therein. In any event, the inner pipe 170 is arranged relative to the cooling coil 174 to contain the liquid medium in close contact with the cooling coil to obtain a maximum heat transfer. In this arrangement the medium 40 passes over and across coil 174 in inner pipe 170 in a first direction.

The liquid medium that exits the inner pipe 170 empties into a space 176 interior of the outer tube 116 and reverses its flow to a second direction opposite the first direction within outer tube 116 to flow to the riser conduits 58. Therefrom the medium flows back into the burn-in chamber 40.

The flow and counterflow of medium in one direction in inner pipe 170 and a second direction in outer tube 116 contributes to reduction in cabinet space required to effect the desired cooling and return of the medium to the tank at a plurality of locations. Baffle 172 prevents the return of cooled medium back into the entrance to inner pipe 170. Outer tube 116 is closed at both ends 178 and 180 to contain the liquid medium therein with the cooling coil 174 entering the outer tube 116 through the end 178.

A portion of the liquid medium discharged into space 176 interior of horizontal tube 116 passes into conduit 60 and therefrom flows through filter 62 and conduit 64 back to chamber 40. The flow through conduit 60 in the preferred embodiment is approximately 10% of the liquid medium discharging into space 176 so that there is a constant filtering of the medium from the tank 38. The filter 62 is intended to remove particulate foreign matter such as scale, solder particles, dirt and all types of foreign substances that are carried by the medium, aids in removing moisture from the liquid medium, and also removes acids, sludge and varnish from the medium. This is important for long term operation of the unit 20 for maximum efficiency.

Tube assembly 112 further comprises a heater element 182, shown in FIG. 3, that extends into space 176. Heater element 182 is any electrical heating device desired, such as a cartridge or coil heater, and functions to raise the temperature of the liquid medium 42 passing thereover to the desired elevated temperature for the burn-in procedure. Thereafter the heating element 82 is not used because the semiconductor devices under test are sufficient to maintain the medium at the elevated temperature, with removal of excess energy by the cooling coil 174.

The arrows in FIGS. 3 and 6 indicate the flow of liquid medium from chamber 40 through conduit 56, through vertically extending conduit 114 passed impeller 120 into outer tube 116 and contained pipe 170, therein across cooling coil 174, into space 176 and therefrom by counterflow in outer tube 116 to the vertical riser pipes 58 and back into chamber 40. The return of medium to the main burn-in chamber at a plurality of locations effects an agitation or turbulence of the medium therein that is beneficial in mixing the medium in the chamber to achieve a homogenous temperature throughout the bath medium. This achieves precise control of the elevated temperature at which the burn-in procedure is effected for closely following the calculated burn-in time requirements. The agitation of the bath medium also is aided by the return of cooled medium to the bottom of the chamber and the removal of medium for cooling from the side of the burn-in chamber. This causes a flow of the medium across the cards carrying the semiconductor devices, also maintaining the semiconductor devices at the desired elevated temperature.

Thus, the function of the main liquid medium heating and cooling system is to elevate the temperature of the heat exchange medium to the desired temperature at which the burn-in procedure is to be effected, and to maintain the medium at that desired temperature through removal of the heat energy produced by the semiconductor devices into the cooling coil arrangement. At the end of the test, the cooling coil arrangement can be used to reduce the temperature of the liquid medium to ambient or room temperature.

Referring now specifically to FIGS. 3, 8 and 9, the vapor recovery system 66 provides recovery of the vapors of the expensive heat exchange medium. Without this or a like recovery system, all of the medium would be lost in a short time through evaporation. System 66 comprises the vapor recovery condensor 68 located below the tank 38, the liquid water separator 70 located to one side of the tank 38 and an exhaust manifold 190 and a feed manifold 192 located at the top side margins of tank 38. Exhaust ducts 194 provide for movement of gases from the upper space 52 of burn-in chamber 40 into the exhaust manifold 190 and feed ducts 196 provide for movement of gases from feed manifold 192 into the upper space 52 of chamber 40.

In operation, the gases in the upper space 52 of chamber 40, which gases include water vapor and vapors of the liquid medium, are pulled by a fan assembly 198, shown in FIGS. 8 and 9, through the exhaust ducts 194 and into the exhaust manifold 190. There, any of the medium vapors that have joined with the water vapor to form hydrofluoric acid are removed and any remaining water vapor picks up metal ions and is made conductive. Therefrom the gases are pushed by the fan assembly down through duct 72 into the vapor recover condensor 68.

Vapor recovery condensor 68 comprises a box-like outer container 200 completely enclosing expansion coil 202 of a mechanical refrigeration device. The gases and vapors from duct 72 pass over the expansion coil 202 and included water vapors and medium vapors are condensed thereon. The condensed water and medium vapors, now in intermixed liquid stage, drip off the bottom of the expansion coil into the bottom of the container 200 to form a pool 204 of intermixed liquid water and liquid medium.

The remaining stripped gases exit from the vapor recovery condensor 68 through return duct 74 into feed manifold 192 wherefrom they are fed into the upper space 52 of chamber 40 through the feed ducts 196 opening through wall 48 at openings 50. Thereafter the stripped gases pass through the length of the chamber 40 between walls 48 and 94 back to the exhaust ducts 194 picking up vapors to complete one cycle.

Gases passing from the feed ducts to the exhaust ducts are used to advantage to remove liquid medium from semiconductor devices 47 carried on cards 46 that are raised to the upper position by the rack 44. While most of the liquid medium drips off of the cards while they are held in the upper space 52, the gases that pass across the semiconductor devices and cards aid in evaporating residual quantities of medium to "dry" the cards.

This can be helpful in draining and "drying" a rack of cards before removal of the cards and devices from burn-in chamber 40 while the other racks of card carried semiconductor devices remain submerged in the liquid medium undergoing the burn-in procedure. In such a situation, after the cards are "dry" of medium, only one segment of the cover need be raised to gain access to the cards.

Referring specifically to FIGS. 8 and 9, the exhaust manifold 190 comprises an outer cylindrical housing 210 closed at one end by a plate 212 and at the other end by the fan assembly 198. The exhaust ducts 194 extend horizontally from the side wall 94 of tank 38 and are bent at a 90° angle to meet the cylindrical housing 210 vertically. The exhaust ducts 194 thus place the interior 214 of the cylindrical housing in gaseous fluid communication with the burn-in chamber 40 interior tank 38.

Mounted interior of cylindrical housing 210 by the plate 212 and an internal baffle 216, are means 218 for removing acids from the gases exhausted from the chamber 40 into the interior 214 of exhaust manifold 190. These means 218 comprise a pair of cylindrical members 220 and 222 concentrically mounted one within the other to form annular space 224 that is filled with an acid absorbing material 226. This material 226 can be such as SODA-SORB or other acid absorbing materials. A drain pipe 228 extends downwardly from the bottom of cylindrical housing 210 to carry any liquids that have condensed in the exhaust manifold such as liquid water and liquid medium to the duct 72 earlier described.

A space 230 interior of cylindrical member 222 is in gaseous fluid communication through an opening 232 in baffle 216 with impeller 236 of the fan assembly 198. The impeller 236 is driven by a motor 238 through a belt 240 and a driven shaft 242. The impeller 236 is mounted in a space 244 opening to the duct 72 earlier described.

In operation the impeller 236 of the fan assembly 198 withdraws gases from the opening 232 into space 244 and forces them into duct 72. This in turn draws gases including water vapor and medium vapor from the upper space 52 of chamber 40 through the exhaust duct 194 to the interior 214 of the cylindrical housing 210. Therefrom the gases pass through fine openings (not shown) in the cylindrical member 220 into close contact with the acid absorbing material 226 in the annular space 224. This removes hydrofluoric acid vapors. The remaining gases and vapors pass through additional fine openings (not shown) in the inner cylindrical member 222 and into the space 230 interior of the cylindrical member 222. Therefrom these gases pass into the opening 232, and are moved by the impeller 236 into the duct 72.

Figure 11:
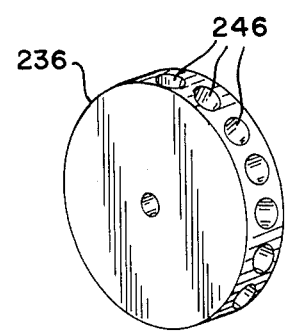
FIG. 11 is a perspective view of the exhaust fan impeller used in the exhaust manifold.

Also referring to FIG. 11, impeller 236 comprises a circular disc of solid material that has a plurality of radially extending openings 246 machined or drilled therein. When rotated by motor 238, impeller 236 centrifically moves gases and vapors radially outwardly from its center into space 244. This provides an inexpensive piece part impeller that can be replaced easily upon excessive wear caused by any unabsorbed hydrofluoric acid that may pass through the acid absorbing means.

The feed manifold 192 comprises a cylindrical housing 250 closed at both ends with the interior thereof in gaseous fluid communication with the chamber 40 through the feed ducts 196. The feed manifold 192 performs the function of roughly equalizing the flow of gases from duct 74 into the several feed ducts 196 to chamber 40.

Figure 12:
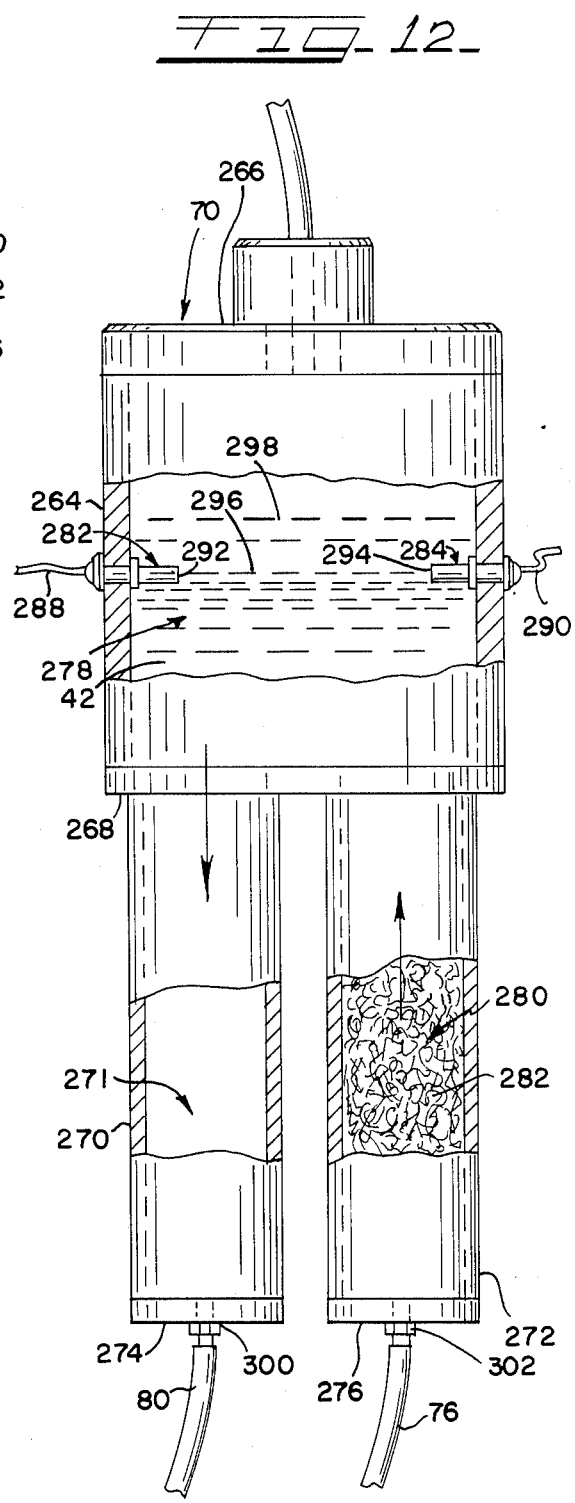
FIG. 12 is a front elevation view, partly in broken away section, of a water separator assembly of the invention.

Turning now to FIGS. 3 and 12, the liquid water separator 70 receives intermixed liquid water and liquid medium from conduit 76 by way of pump 260 from pool 204 in the vapor recovery condensor 68. The liquid water separator 70 feeds separated liquid medium back to chamber 40 through conduit 80 by way of pump 262. Conduit 80 returns the liquid medium to the tank 38 and chamber 40 well above the top surface of the liquid medium 42 to prevent a siphoning of the liquid medium back into the liquid water separator 70.

The purpose of separator 70 is to separate the liquid medium from the liquid water so that the expensive liquid medium can be reused in the burn-in chamber 40. It is desired to remove the liquid water to prevent formation in the bath of hydrofluoric acid that can corrode the tank, racks, cards and semiconductor devices.

Liquid water separator 70 comprises an upstanding cylindrical housing 254 closed at its top by a cover 266 and at its bottom by a base 268 and having a pair of depending cylindrical tubes 270 and 272, which are closed at their bottom ends by bases 274 and 276. Housing 264 defines a substantially cylindrical separator chamber 278 that is in fluid communication with a well 271 interior of depending tube 270 and a well 280 interior of the depending tube 272. A diffuser material 282 such as a rolled web of stainless steel mesh is installed in the well 280 of the tube 272 for a purpose to be dscribed presently.

Liquid water separator 70 further comprises a pair of electrodes 282 and 284 each connected to a bridge circuit 286 by conductor leads 288 and 290. The electrodes 282 and 284 extend radially through the wall of the housing 264 at a certain level so that their tips 292 and 294 are in fluid communication with any liquids or gases in the separator chamber 278 interior of the housing 264.

In operation, and initially, the interior of the housing and the two depending tubes are filled only with bath liquid medium and are void of any liquid water. When the burn-in procedure commences, quantities of liquid intermixed water and medium will be pumped up from pool 204 through conduit 76 into well 280 and therefrom into chamber 278. The liquid entering chamber 278 from the well 280 of tube 272 will do so in a substantially planar flow, because the mesh material 282 has greatly diffused the stream of flow resulting from the liquid entering from conduit 76. This prevents any turbulence or agitation of the intermixed liquids in chamber 278 so that the liquid water can rest and separate from the liquid medium and rise to float above the liquid medium at the top of chamber 278. Suitable controls (not shown) are provided so that chamber 278 remains substantially filled with liquid.

During the course of the burn-in procedure, the liquid water separating from the intermixed liquids in the bottom of chamber 278 will increase in volume from the top of chamber 278 downwardly. When the interface 296 between the liquid water 298 and the liquid medium 42 touches both of the tips 292 and 294 of the electrodes 282 and 284, an electrical signal can be conducted through the liquid water because it is conductive, the conductivity resulting from the water vapors passing through the acid absorbing material 226 in the exhaust manifold 190. No electrical signal passes between the electrodes 282 and 284 while they are submerged in only the liquid medium because the liquid medium is non-conductive.

The electrical signal flowing between the two electrodes causes a change in the balance of a bridge circuit 286 and an indicator is activated so that the operator may manually removed the liquid water from the liquid water separator 70 with such as a syringe. This is performed by lifting the cover 266 from the housing 264 for manual removal of the liquid water 298. Alternatively, the liquid water can be removed automatically through the conduit 78 schematically illustrated in FIG. 2.

The flow of intermixed liquid into the liquid water separator 70 is minimal and provides for the liquid substantially to rest in chamber 278 for the lighter specific density liquid water to rise and float above the heavier specific density heat exchange medium. This separation of the liquid water from the liquid medium aids in reducing the quantity of hydrofluoric acid formed in the tank 38, increasing the life of the tank and related pipes, ducts and conduits.

While the well 280 serves to contain the diffuser means 282, the well 271 serves another, equally important purpose. There is a substantial distance between the outlet port 300 in the bottom of well 271 through base 274 and the level of the two electrode tips 292 and 294 indicated by the water/medium interface 296. This distance in separator chamber 278 and well 271 forms a long stable column of mainly liquid medium that, due to the differences in specific gravities, strongly urges any intermixed liquid water to separate, rise above and float on the medium. This urging is greatest at the bottom of well 271 adjacent outlet port 300 and results in medium containing the least amount or concentration of intermixed liquid water first being removed from the bottom of well 271 and separator 70. This effect also occurs adjacent inlet port 302 in the base 276 of well 280 but the separated liquid heat exchange medium has to rise into separator chamber 278 before it can be removed through outlet port 300.

Referring first to FIG. 3, but also to FIGS. 13 and 14, the filtration system includes a weir assembly 303 located in burn-in chamber 40 adjacent port 304 through which medium 100 flows from chamber 40 into conduit 56. Weir assembly 303 intentionally blocks clear flow of medium 100 into port 304 to channel solid, particulate contaminants that float on top of medium to port 304 and eventually to filter element 62 where they are trapped for later removal from the system. Weir assembly 303 thus forms a turbulence box 305 into which the top layer of medium cascades from over the weir to agitate the floating contaminants into suspension for delivery to the filter element 62.

Referring also to FIGS. 13 and 14, weir asesmbly 303 comprises a pair of imperforate plates, being a fixed lower plate 306 and an movable upper plate 307. A leaf spring 308 attached to upper plate 307 acts to maintain upper plate 307 in a desired position. Plates 306 and 307 mount in tracks 310 and 312 that are secured to heat exchanger tank walls 90 and 98 by such as spot welding. Lower plate 304 rides in slot 314 between rails 316 and 318 of each track and plate 307 rides in slot 320 between rails 318 and 322 of each trade. Leaf springs 308 are secured to upper plate 307 at area 324 by such as spot welding and engage against rails 322 to press the upper plate 307 against rail 318 to maintain it in position. Tracks 310 and 312 and plates 306 and 307 are dimensioned to prevent leakage of the medium 100 into turbulence box 305, which is formed of weir assembly 303, and heat exchanger tank front wall 90, end wall 94, bottom wall 96 and back wall 98.

The bottom edge 326 of lower plate 306 intentionally is set by screws 327 slightly spaced from bottom wall 96 to provide a passage for medium 100 therethrough into the bottom of turbulence box 305. This assures a continuous, but minimal flow of medium 100 to port 304 and the main heating and cooling in the event the level of the medium in chamber 10 falls below the top edge 328 of upper plate 307 and cannot otherwise flow to port 304. This can occur normally when the system is first being heated and the volume of the cold medium 100 is minimal. When the temperature and volume of medium 100 increases to operating range, the upper plate 307 is manually adjusted to locate the top edge 328 thereof approximately one half to one quarter inch below the top surface 330 of the medium 100. This establishes a flow of the top layer 334 of medium 100, which carries solid, particulate contaminants floating thereon, from the bath to the turbulence box. There, the contaminants are agitated and mixed with the medium 100 to be carried by the medium through port 304 and conduit 56 to the filter element for removal from the medium. This agitation and mixing is facilitated by the medium falling over the top edge 328 of movable upper plate 307 into turbulence box 305. This flow of the top layer 332 of medium 100 maintains the top surface 330 clean and free of contaminants and debris.

The burn-in procedure effecting unit 20 thus provides a structure that aids an operator in placing semiconductor devices in the tank burn-in chamber for the procedure and removing the devices after completion of the procedure. The unit includes special provisions for maintaining the heat exchange bath medium at the desired, elevated temperature for effecting the procedure precisely and for re-cycling evaporated medium into the bath. Moisture, in the form of liquid water and water vapor, is removed substantially to protect the unit components from the attack of hydrofluoric acid that can form from interaction of the moisture and heat exchange medium. An included filter removes from the liquid medium particulate matter, chemical contaminants and moisture.

All of this is provided in a unit that is self-contained after connection to an electrical power source and that has a burn-in chamber capable of effecting the procedure on production quantities of semiconductor devices.

While the invention has been described with reference to a preferred embodiment, it will be understood by those skilled in the art that various changes may be made and equivalents may be substituted for elements thereof without departing from the broader aspects of the invention. It is intended that broad claims not specifying details of a particular embodiment disclosed herein as the best mode contemplated for carrying out the invention should not be limited to such details. Generally, while specific claimed details of the invention constitute important specific aspects of the invention, in appropriate instances even the specific claims involved should be construed in light of the doctrine of equivalents.

I claim:

1. An apparatus for thermally stressing for an extended period a plurality of semiconductor devices at an elevated temperature in a bath of an inert, substantially electrically insulating, liquid heat exchange medium, the medium having a specific heat greater than air and a boiling point greater than said elevated temperature, and said semiconductor devices being electrically operated to produce excess heat while being thermally stressed for said extended period, said apparatus comprising:
   a tank having a sealable burn-in chamber adapted to receive therein said semiconductor devices, the tank further being adapted to receive therein a quantity of said liquid medium sufficient to cover said semiconductor devices while they are being electrically operated and the medium having said elevated temperature, said tank having sufficient size for said chamber to include an upper free space containing ambient gases, in which water vapor can be present, above said medium sufficient for said semiconductor deices to be positioned in said free space and be clear of said medium;
   cooling means in liquid communication with said chamber and adapted to remove said excess heat from said liquid medium to maintain said liquid medium substantially at said elevated temperature, said cooling means being exterior of said chamber;
   pump means adapted to move said liquid medium from said tank to said cooling means back to said tank with said liquid medium entering said chamber at plural locations to produce agitation of the liquid medium therein, so that said apparatus maintains a substantially uniform temperature throughout the medium in said tank chamber; and
   vapor recovery means for removing vapors of at least said medium from said upper free space in a closed loop from and to said upper free space, said vapors being condensed to liquid medium and liquid water and said condensed liquid medium being returned to said liquid medium in said chamber substantially free of any liquid water vapor simultaneously condensed.

2. The apparatus of claim 1 in which said apparatus is self-contained upon connection to an electrical power source.

3. The apparatus of claim 1 in which said tank has at least four side walls and a bottom wall in a rectangular configuration open to the top, and a sealable cover, said walls defining said chamber interior of said tank and cover to form said upper, free space above the liquid medium, and a lower space of said chamber that contains said liquid medium.

4. The apparatus of claim 1 including conduit means connected to the walls of said tank for carrying said medium between said chamber and cooling means.

5. The apparatus of claim 1 in which said cooling means include an inner pipe surrounding at least one cooling coil with said pipe containing a flow of said medium in one direction from said chamber around said cooling coil.

6. The apparatus of claim 5 in which said cooling means include an outer tube containing said inner pipe and arranged to contain a flow of said medium exiting said inner pipe in a second direction opposite said one direction, and a baffle across the interior of said tube to said inner pipe to block said medium exiting said pipe from returning through said pipe without first returning to said chamber 7. The apparatus of claim 6 including conduit means having a plurality of riser conduits extending from said outer tube to said tank to return said medium to said chamber.

8. The apparatus of claim 5 including conduit means having a conduit extending from said tank to said pump means and inner pipe to remove medium from said chamber to said cooling means.

9. The apparatus of claim 1 in which said cooling means are integral with said tank.

10. The apparatus of claim 5 in which said cooling coil is an expansion coil of a mechanical refrigeration unit.

11. The apparatus of claim 1 in which said cooling means include heater means for increasing the temperature of said medium to said elevated temperature.

12. The apparatus of claim 6 including filter means for filtering approximately ten percent of the liquid medium exiting said inner tube and returning the filtered medium to said tank.

13. A method of thermally stressing for an extended period a plurality of semiconductor devices at an elevated temperature, said method comprising:
   installing said semiconductor devices in operative relationship in a sealable bath of a liquid heat exchange medium that has said elevated temperature, is inert, is substantially electrically insulating, has a specific heat greater than air and has a boiling point greater than said elevated temperature to subject said devices to said elevated temperature for an extended period and dissipate excess operating heat of said devices in said medium;
   cooling said medium at a cooling device separated from said bath to remove said excess operating heat from said medium and maintain said medium substantially at said elevated temperature;
   agitating the medium of said bath by moving said cooled medium back into said bath at plural locations to maintain a substantially uniform temperature throughout the medium in said bath;
   furnishing an upper free space above said bath of liquid medium than can contain ambient gases including water vapor and said semiconductor devices clear of said medium before and after they have been installed in said bath; and
   removing vapors of at least said medium from said free space in a closed loop from and to said free space, including condensing said vapors to liquid medium and liquid water and returning said condensed liquid medium to said bath substantially free of any liquid water vapor simultaneously condensed.

14. The method of claim 13 in which said installing includes containing said medium in a lower space of a tank burn-in chamber and mounting said devices on racks in said free space of said chamber above said liquid medium.

15. The method of claim 13 including pumping said medium between said bath and a separated cooling device.

16. The method of claim 13 in which said cooling includes containing a flow of liquid medium from said bath in one direction over a cooling coil within an inner pipe.

17. The method of claim 16 including containing a flow of liquid medium exiting from said pipe in a second direction opposite said one direction in an outer tube.

18. The method of claim 17 including conducting liquid medium from said outer tube to said bath in riser tubes.

19. The method of claim 16 including pumping said liquid medium from said bath to said inner pipe.

20. The method of claim 17 including stopping said flow of liquid medium in said outer tube from re-entering said inner pipe after said medium exits said inner pipe.

21. The method of claim 13 in which said agitating includes removing liquid medium from said bath at one location and returning the cooled liquid medium to said bath at said plural locations.

22. The method of claim 13 in which said installing includes heating said liquid medium to said elevated temperature with a heater at said cooling device.

23. The method of claim 17 including filtering approximately ten percent of the liquid medium exiting said inner pipe and returning it to said bath 24. An apparatus for thermally stressing for an extended period a plurality of semiconductor devices at an elevated temperature in a bath of an inert, substantially electrically insulating liquid heat exchange medium that has a specific heat greater than air and a boiling point greater than said elevated temperature, said apparatus comprising:
a tank having a burn-in chamber adapted to receive therein a quantity of said medium having said elevated temperature, said chamber including an upper free space and a lower space, said lower space containing said liquid medium and said upper space containing ambient gases and water vapors;
at least one rack located in said chamber and adapted to carry said semiconductor devices thereon, said rack being movable between a raised position spaced above said medium in said upper free space in which position said rack is adapted to receive said semiconductor devices and in which said medium can be removed from said devices and a home position in which said rack and any carried semiconductor devices are immersed in said medium;
movement means for moving said rack between said raised and home positions; and
vapor recovery means for removing vapors of at least said medium from said free space in a closed loop from and to said upper free space, said vapors being condensed to liquid medium and liquid water and said liquid medium being returned to said liquid medium in said lower space substantially free of any liquid water vapor simultaneously condensed.

25. The apparatus of claim 24 including a cover arranged to close the open top of said chamber, there being a plurality of racks in said chamber and said cover having a plurality of segmented portions each aligned with one rack, so that each rack can be accessed through one segmented portion of the cover without having to raise the entire cover.

26. The apparatus of claim 24 in which said rack includes a plurality of circuit card connectors adapted to receive and operate circuit cards carrying said semiconductor devices.

27. The apparatus of claim 24 in which said movement means include a pneumatic cylinder to raise and lower a shaft carrying said rack.

28. The apparatus of claim 24 in which there are a plurality of racks that are each capable of being raised and lowered independent of the other racks.

29. A method of thermally stressing for an extended period a plurality of semiconductor devices at an elevated temperature, said method comprising:
mounting said semiconductor devices in a chamber on at least one rack extending up into a free space in said chamber from an underlying bath of a liquid heat exchange medium having said elevated temperature, said free space containing ambient gases and water vapor;
lowering said rack carrying said semiconductor devices into said bath medium to fully immerse said semiconductor devices therein;
electrically operating said semiconductor devices for an extended period while they are immersed in said bath;
raising said rack carrying said semiconductor devices into said free space above said bath after expiration of said extended period;
recovering vapors of at least said liquid medium occurring in said free space by condensing said vapors to liquid medium and liquid water to return said condensed liquid medium to said bath substantially free of said any liquid water vapor simultaneously condensed and conserve said liquid medium; and
removing said semiconductor devices from said at least one rack.

30. The method of claim 29 including aligning a segmented cover portion of a cover with said rack and raising only that segmented portion to gain access to said rack for mounting said semiconductor devices on said rack.

31. The method of 30 including aligning each of a plurality of segmented portions of said cover with one of a plurality of racks extending up from said bath medium.

32. The method of claim 29 including automatically lowering said rack into said bath medium.

33. The method of claim 29 including providing a plurality of racks extending up from said bath medium and lowering each rack independent of the other racks.

34. The method of claim 33 including automatically lowering each rack into said bath medium.

35. An apparatus for thermally stressing a plurality of semiconductor device at an elevated temperature in a bath of an inert, substantially electrically insulating heat exchange medium, the medium being liquid, having a specific heat greater than air and a boiling point greater than said elevated temperature and said devices being electrically operated to produce excess heat thereby while being thermally stressed, said apparatus comprising:
a tank defining a burn-in chamber adapted to receive said medium having said elevated temperature with said devices immersed in said medium, said chamber having a depth sufficient to present a free space containing ambient gases above said medium and immersed device in which evaporated vapors of said medium can be contained and in which water vapor can be present; and
vapor recovery means in fluid communication with said chamber for condensing any said vapors collected from said free space into liquid medium and liquid water and to return said condensed liquid medium to said chamber substantially free of any liquid water vapor simultaneously condensed.

36. An apparatus for thermally stressing a plurality of semiconductor devices at an elevated temperature in a bath of an inert, substantially electrically insulating, liquid heat exchange medium, the medium having a specific heat greater than air and a boiling point greater than said elevated temperature and said devices being electrically operated to produce excess heat thereby while being thermally stressed, and said liquid medium additionally having a specific gravity greater than liquid water so that liquid water tends to rise above and float on said liquid medium while at rest, said apparatus comprising:

- a tank defining a burn-in chamber adapted to receive in said chamber said liquid medium having said elevated temperature with said device immersed in said medium, said chamber having a depth sufficient to present a free space above said medium and immersed devices in which vapors of said medium can be contained and in which water vapor can be present;
- exhaust means in fluid communication with said chamber free space adapted for removing said vapors from said free space, said exhaust means including acid absorbing means adapted for absorbing any acid vapors removed from said space, and adapted for making conductive any water vapor removed from said free space;
- condensor means adapted for condensing into liquid any said vapors removed from said chamber free space by said exhaust means;
- feed manifold means adapted for returning any uncondensed vapors from said condensor means to said chamber free space; and
- return means adapted for returning to said chamber any of said medium condensed into a liquid by said condensor means, said retun means including separator means adapted for separating from said liquid medium, prior to said liquid medium being returned to said chamber, any liquid water condensed form water vapor by said condensor means, said liquid water being electrically conductive as a result of action of said acid absorbing means and said separator means including elecrical circuit means adapted for detecting the presence of liquid water separated from said liquid medium.

37. The apparatus of claim 36 in which said exhaust means include an exhaust manifold external said chamber containing said acid absorbing means and receiving said vapors from said burn-in chamber free space at a plurality of locations.

38. The apparatus of claim 37 including fan means for moving said vapors from and to said burn-in chamber free space.

39. The apparatus of claim 37 including a drain for conducting condensed liquids in said exhaust manifold to said separator means.

40. The apparatus of claim 38 in which said fan means are mounted on said exhaust means and draw said vapors from said chamber through said acid absorbing means.

41. The apparatus of claim 40 in which said acid absorbing means are concentrically mounted in said exhaust manifold and said fan means are mounted at one end of said acid absorbing means.

42. The apparatus of claim 38 including an impeller that is a disc having radial passages drilled therein 43. The apparatus of claim 36 in which said condensor means includes the expansion coil of a mechanical refrigeration unit over which the medium and water vapors are passed and the condensed liquids are intermixed.

44. The apparatus of claim 36 in which said feed manifold returns said uncondensed vapors to said chamber at a plurality of locations opposite said exhaust means.

45. The apparatus of claim 36 in which said return means receive intermixed liquid medium and water from said condensor means and said separator means include a separator chamber adapted to bring said intermixed liquid medium and water to a rest so that said liquid water can separate from to rise above and float on said liquid medium, said electrical circuit means include electrodes extending into said chamber at a certain level and adapted to effect an electrical signal through said liquid water when said liquid water attains said certain level 46. The apparatus of claim 45 in which said separator includes a pair of wells depending from said main chamber, an inlet port for receiving said intermixed liquid medium and water at the bottom of one well and an outlet port for removing separated liquid medium at the bottom of the other well.

47. The apparatus of claim 46 in which said separator means includes diffuser means in said well including said inlet port adapted to provide a substantially laminar flow of liquid into said separator chamber from said well.

48. The apparatus of claim 47 in which said diffuser means is a web of stainless steel wire mesh.

49. The apparatus of claim 45 in which said electrical circuit means include a bridge circuit connected to said electrodes to indicate the presence of an electrical signal passing through said electrodes.

50. The apparatus of claim 45 including conduit means carrying intermixed liquid medium and water from said condensor means to said separator chamber.

51. The apparatus of claim 45 in which said return means include pump means adapted for moving intermixed liquid from said condensor means to said separator chamber and pump means adapted for moving liquid medium from said separator chamber to above the level of the liquid medium to be in said burn-in chamber.

52. An apparatus for thermally stressing a plurality of semiconductor devices at an elevated temperature in a bath of an inert, substantially electrically insulating liquid heat exchange medium, the medium having a specific heat greater than air and a boiling point greater than said elevated temperature, the medium further having a specific gravity greater than water so that solid contaminants can float on top of said medium as well as being suspended in said medium, said apparatus comprising:

- a tank having a burn-in chamber adapted to receive therein said semiconductor devices and being adapted to receive therein a quantity of said liquid medium to effect said bath;
- filter means in fluid communication with said burn-in chamber and adapted to effect a flow of said medium therethrough for removing solid contaminants from said liquid medium and maintaining the cleanliness of said semiconductor devices; and
- weir means that are imperforate arranged in said burn-in chamer of said tank for causing said flow of medium to be effected substantially from a top surface of said bath to channel said solid contaminants that can float on top of said medium and said solid contaminants that are suspended in said medium to said filter means.

53. The apparatus of claim 52 in which said weir means includes an imperforate wall extending within said tank to form an agitation box separate from said bath but in a poriton of said butn-in chamber with the flow of medium from the top surface of said bath falling over the top of said wall to agitate and mix together the contaminants and medium.

54. The apparatus of claim 52 in which said weir means includes an imperforate lower plate fixed in position and an imperforate upper plate adjustable to effect said flow of medium sustantially from a top surface of said bath.

55. The apparatus of claim 54 in which said weir means includes a pair of tracks mounted on the walls of said tank for carrying said upper and lower plates.

56. The apparatus of claim 55 in which said weir means includes leaf springs engaged in said tracks for maintaining the position of said upper plate.

57. The apparatus of claim 52 in which said weir means stand spaced from the bottom of said burn-in chamber to provide a passage between weir means and tank for at least a minimal flow of medium to said filter means.

58. The apparatus of claim 57 in which said weir means includes an imperforate lower plate fixed in position spaced from the bottom wall of said tank to form said passage.

59. An apparatus for thermally stressing a plurality of semiconductor devices at an elevated temperature in a bath of an inert, substantially electrically insulating, liquid heat exchange medium, the medium having a specific heat greater than air and a boiling point greater than said elevated temperature and said devices being electrically operated and producing excess heat thereby while being thermally stressed, and said liquid medium having a specific gravity greater than liquid water so that liquid water tends to rise above and float on said liquid medium while at rest, said apparatus comprising:

a tank defining a burn-in chamber adapted to receive in said chamber said liquid medium at said elevated temperature with said devices immersed in said medium, said chamber having a depth sufficient to present a free space above said medium and immersed devices in which vapors of said medium can be contained and in which water vapor can be present;

cooling means in liquid communication with said chamber and adapted to remove said excess heat from said liquid medium to maintain said liquid medium substantially at said elevated temperature, said cooling means being exterior of said chamber;

pump means adapted to move said liquid medium from said tank to said cooling means and back to said tank with said liquid medium entering said chamber producing agitation of the liquid medium therein, so that said apparatus maintains a substantially uniform temperature throughout the medium in said tank chamber;

at least one rack located in said chamber and adapted to carry said semiconductor devices thereon, said rack being movable between a raised position spaced above said medium and in which position said rack is adapted to receive said semiconductor devices and a home position in which said rack and any carried semiconductor devices are immersed in said medium;

movement means for moving said rack between said raised and home positions;

exhaust means in fluid communication with said chamber free space adapted for removing said vapors from said free space, said exhaust means including acid absorbing means adapted for absorbing any acid vapors removed from said free space, and adapted for making conductive any water vapor removed from said free space;

condensor means adapted for condensing into liquid any said vapors removed from said chamber free space by said exhaust means;

feed manifold means adatped for returning any uncondensed vapors from said condensor means to said chamber free space;

return means adapted for returning to said chamber any of said medium condensed into a liquid by said condensor means, said return means including separator means adapted for separating from said liquid medium, prior to said liquid medium being returned to said chamber, any liquid water condensed from water vapor by said condensor means, said liquid water being electrically conductive as a result of action of said acid absorbing means and said separator means including electrical circuit means adapted for detecting the presence of liquid water separated from said liquid medium; and weir means arranged in said burn-in chamber of said tank for causing said flow of medium to be effected substantially from a top surface of said bath to channel said solid contaminants that can float on top of said medium and said solid contaminants that are suspended in said medium from said bath.

* * * * *